US007750661B2

(12) United States Patent
Hsu

(10) Patent No.: US 7,750,661 B2
(45) Date of Patent: Jul. 6, 2010

(54) METHOD OF TESTING LIQUID CRYSTAL DISPLAY

(75) Inventor: Sheng-kai Hsu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/689,893

(22) Filed: Mar. 22, 2007

(65) Prior Publication Data

US 2008/0048708 A1 Feb. 28, 2008

(30) Foreign Application Priority Data

Aug. 7, 2006 (TW) .............................. 95128896 A

(51) Int. Cl.
*G01R 31/00* (2006.01)

(52) U.S. Cl. ....................................... 324/770; 324/765

(58) Field of Classification Search ................. 324/770, 324/158.1, 754–765; 438/14
See application file for complete search history.

(56) References Cited

U.S. PATENT DOCUMENTS 4,820,222 A * 4/1989 Holmberg et al. .............. 445/3
5,057,775 A * 10/1991 Hall ........................... 324/770
5,453,991 A * 9/1995 Suzuki et al. ............... 714/724
5,465,053 A * 11/1995 Edwards ..................... 324/770
5,546,013 A * 8/1996 Ichioka et al. .............. 324/770
5,576,730 A * 11/1996 Shimada et al. ............... 345/98
5,729,316 A * 3/1998 Yamamura et al. .......... 349/150
6,515,723 B1 * 2/2003 Suzuki ........................ 349/73
6,750,926 B2 6/2004 Ohgiichi et al.
6,873,174 B2 * 3/2005 Matsunaga et al. .......... 324/770
6,928,606 B2 * 8/2005 Savaria et al. ............... 714/797
7,145,539 B2 * 12/2006 Lim ............................ 345/98
7,265,572 B2 * 9/2007 Osada ........................ 324/770
2003/0034967 A1 * 2/2003 Imajo ......................... 345/211
2004/0183985 A1 9/2004 Taguchi
2005/0093567 A1 * 5/2005 Nara et al. .................. 324/770
2005/0206404 A1 * 9/2005 Itagaki ....................... 324/770
2005/0243049 A1 * 11/2005 Ueda ........................... 345/98
2005/0270059 A1 * 12/2005 Ando ......................... 324/770
2006/0097745 A1 * 5/2006 Imura et al. ................. 324/770
2006/0120485 A1 * 6/2006 Kosaka ....................... 375/318
2006/0226866 A1 * 10/2006 Ando ......................... 324/770

* cited by examiner

*Primary Examiner*—Ha Tran T Nguyen
*Assistant Examiner*—Richard Isla Rodas

(57) ABSTRACT

A method of testing a liquid crystal display includes the steps of forming a plurality of chip positioning areas with a plurality of data connecting ends on a glass substrate, forming a plurality of data wires between two adjacent chip positioning areas which are linked to the plurality of data connecting ends of the two adjacent chip positioning areas, forming a testing circuit on each chip positioning area, which is linked to a predetermined amount of data connecting ends, and probing two testing circuits of two chip positioning areas to obtain an electrical parameter.

9 Claims, 8 Drawing Sheets

METHOD OF TESTING LIQUID CRYSTAL DISPLAY

BACKGROUND OF THE INVENTION

1. Field of the Invention

The present invention relates to a method of testing a liquid crystal display, and more particularly, to a method of testing a liquid crystal display during its manufacturing process.

2. Description of the Related Art

With a rapid development of monitor types, novelty and colorful monitors with high resolution, e.g., liquid crystal displays (LCDs), are indispensable components used in various electronic products such as monitors for notebook computers, personal digital assistants (PDA), digital cameras, and projectors. The demand for the novelty and colorful monitors has increased tremendously.

FIG. 1 is a schematic diagram of liquid crystal display 10 according to the prior art. The liquid crystal display 10 contains a substrate 12 made of glass, a plurality of source drivers 16*a*-16*h*, a plurality of gate drivers 18, and a display area 20. The source drivers 16*a*-16*h*, the gate drivers 18 and the display area 20 are all disposed on the substrate 12. A timing controller 14, disposed on a printed circuit board 22, is used for generating clock signal to the plurality of gate drivers 18. The plurality of source drivers 16*a*-16*h* are connected in cascade. The source driver 16*a* is coupled to the timing controller 14. When receiving clock signal from the timing controller 14, the plurality of gate drivers 18 can generate scan signal to the display area 20, meanwhile, the timing controller 14 generates clock signal and data signal to the source drivers 16*a*-16*h*. Accordingly, the display area 20 can produce an image based on the signals from the source driver 16*a*-16*h* in response to the scan signal.

Traditionally, the techniques for fixing the glass substrate and the drivers are divided into Tape Automated Bonding (TAB), Chip on Film (COF) and Chip on Glass (COG). Both techniques of the tape automated bonding and the chip on film are to adhere the drivers on a flexible circuit board which is adhered to the glass substrate. However, the technique of Chip on Glass (COG) is to adhere the drivers on the glass substrate directly.

Whatever technique is adopted, once the drivers are fixed, a procedure of testing normalcy of data transmission between two adjacent drivers is necessary. If one of the drivers is malfunctioning or a signal line connected between two adjacent drivers is cut, taking the faulty liquid crystal display away from production line is required. Therefore, subsequent to forming signal line connected between two adjacent drivers, utilizing a simple procedure of detecting whether the signal line is normal in time is proper and convenient, especially in mass production of liquid crystal display. If one of the drivers fails to transmit a signal normally or a signal line connected between two adjacent drivers is cut, eliminating the malfunction driver or mending the signal line is proper to avoid flowing into next manufacture process.

SUMMARY OF THE INVENTION

An objective of the present invention is to provide a method of testing a liquid crystal display during manufacturing process.

Briefly summarized, the claimed invention provides a method of testing a liquid crystal display. The method comprises the steps of (a) forming a plurality of chip positioning areas on a glass substrate, each of the plurality of chip positioning areas comprises a plurality of data linking terminals;

(b) forming a plurality of signal lines between the neighboring chip positioning areas, the plurality of signal lines being linked between two of the plurality of data linking terminals; (c) forming a first testing circuit on one of the plurality of chip positioning areas, the first testing circuit is connected to a first predetermined number of data linking terminals; and (d) probing the first testing circuit to obtain a first electrical parameter.

According to the claimed invention, a method of testing a liquid crystal display comprises the steps of (a) installing a first driver and a second driver on a substrate, the first driver and the second driver being linked via a plurality of signal lines; (b) forming a testing circuit which is electrically connected to the first driver; (c) probing the testing circuit to obtain a electrical parameter; and (d) altering the first driver while the electrical parameter is inconsistent with a predetermined value.

The disclosed inventions will be described with references to the accompanying drawings, which show important example embodiments of the inventions and are incorporated in the specification hereof by related references.

DETAILED DESCRIPTION OF THE PREFERRED EMBODIMENT

Figure 1:
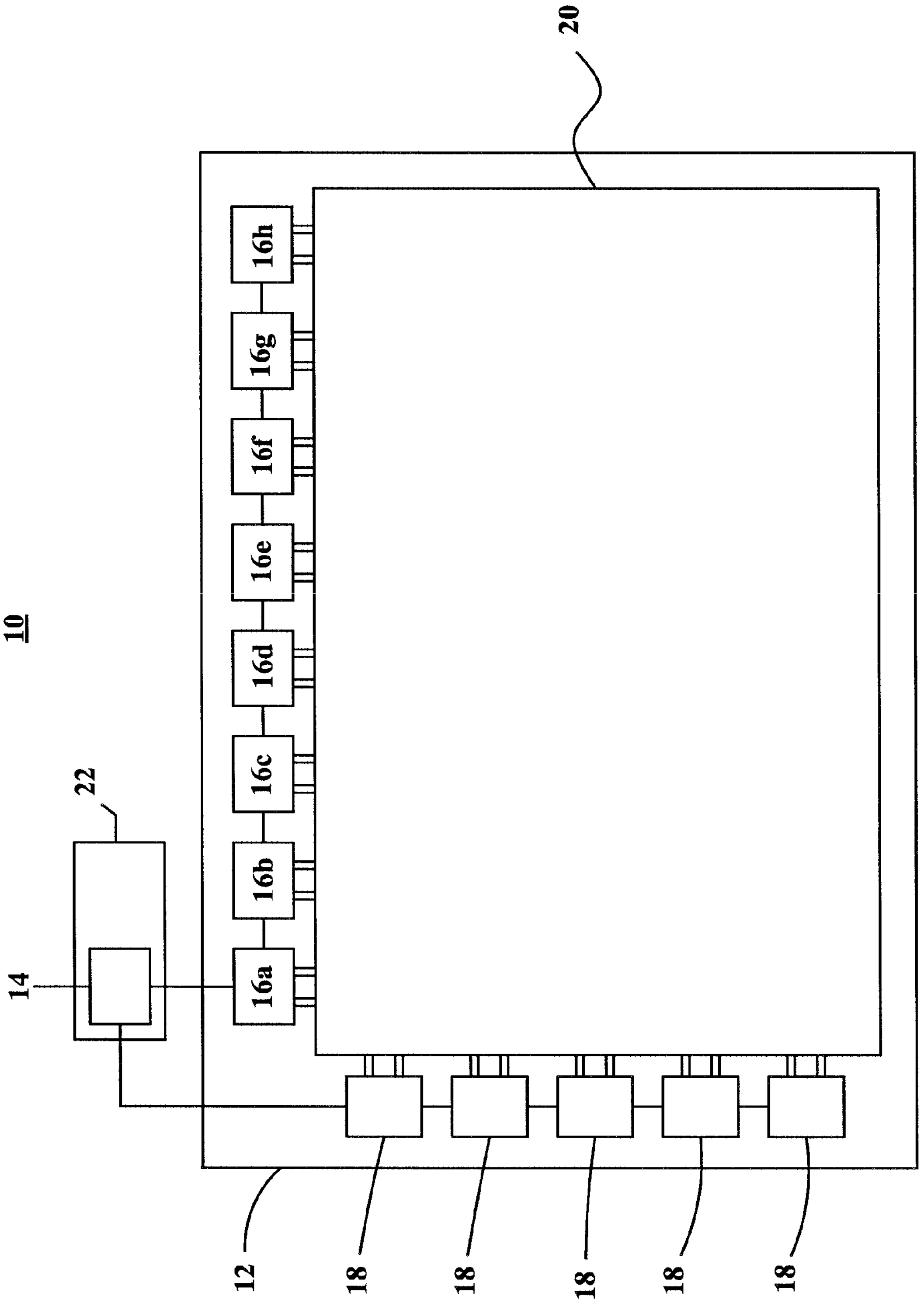
FIG.1(Prior art)
FIG. 1 is a schematic diagram of liquid crystal display according to the prior art.
Figure 2:
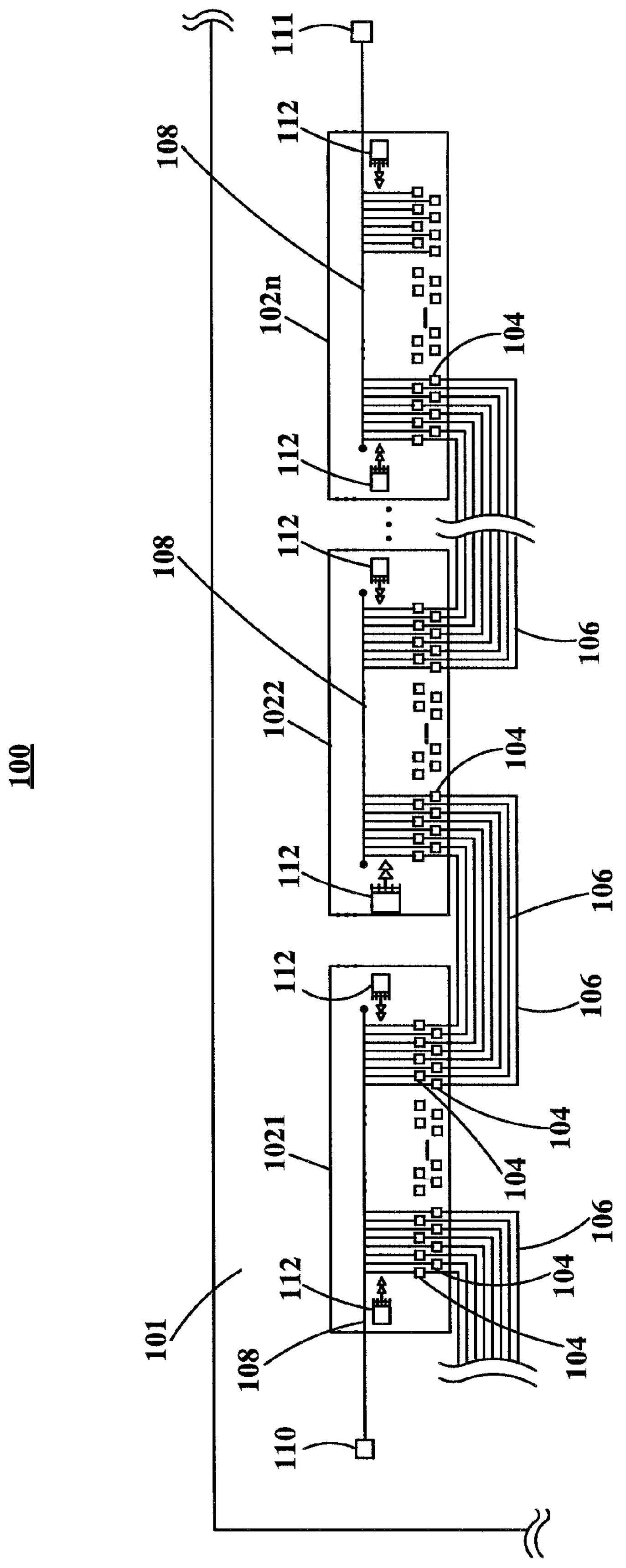
FIG. 2 shows a glass substrate of a liquid crystal display before the drivers are installed on the glass substrate.
Figure 3:
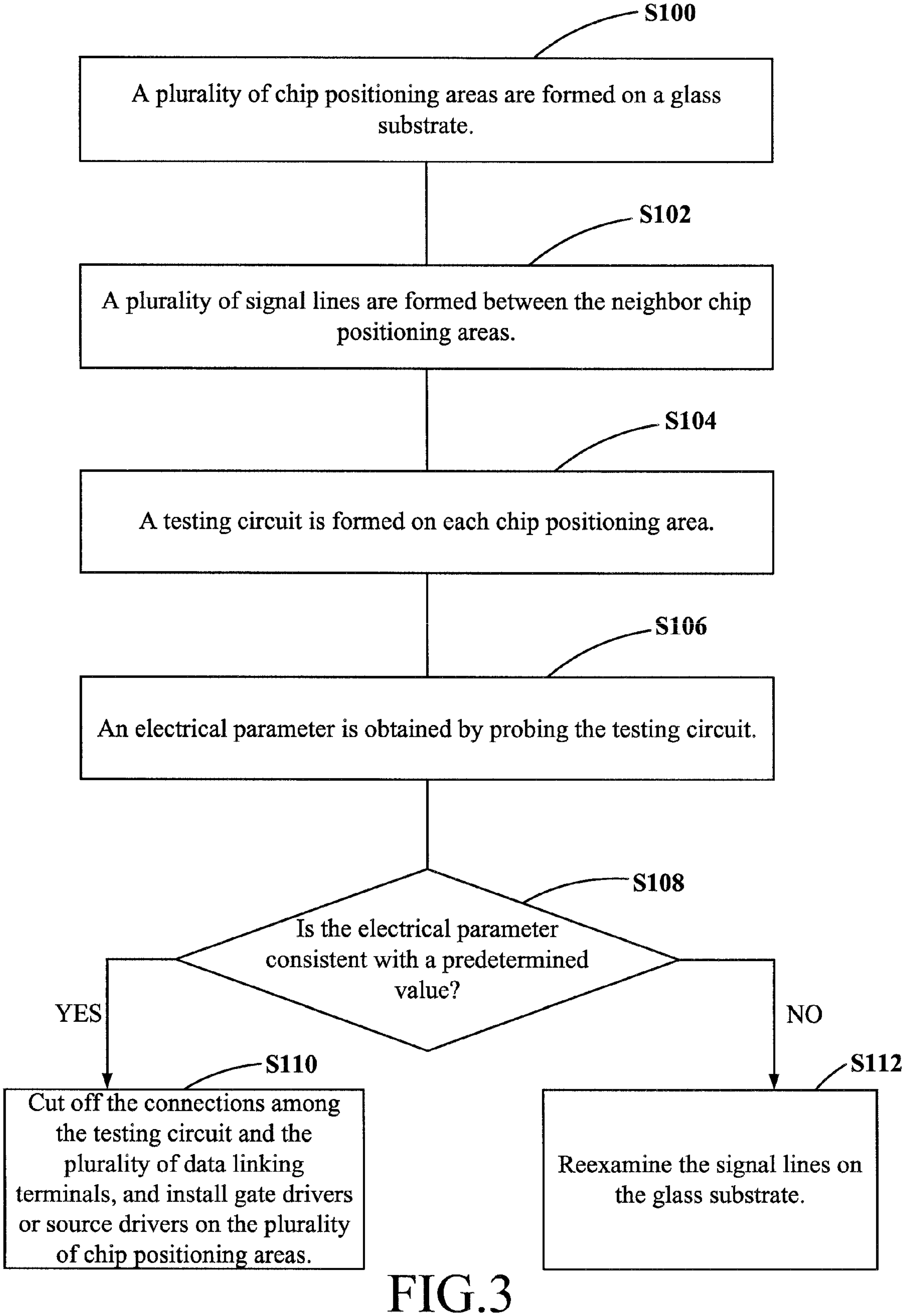
FIG. 3 is a flow chart of testing the glass substrate depicted in FIG. 2.

FIG. 2 shows a glass substrate 101 of a liquid crystal display 100 before the drivers are installed on the glass substrate 101. FIG. 3 is a flow chart of testing the glass substrate depicted in FIG. 2. The method of testing the glass substrate comprises the following steps:

Step S100: A plurality of chip positioning areas 1021-102*n* are formed on a glass substrate 101. A plurality of data linking terminals 104 (for clarify, only part of data linking terminals are labeled in FIG. 2) are disposed on the plurality of chip positioning areas 1021-102*n*.

Step S102: A plurality of signal lines 106 are formed between the neighboring chip positioning areas. The plurality of signal lines 106 are linked between the plurality of data linking terminals 104 of the neighboring chip positioning areas Step S104: A testing circuit 108 is formed on each chip positioning area, and is connected to the plurality of data linking terminals 104.

Step S106: By probing the testing circuit 108, an electrical parameter is obtained.

Step S108: Is the electrical parameter consistent with a predetermined value?

Step S110: If the electrical parameter is consistent with the predetermined value, the connections among the testing circuit 108 and the plurality of data linking terminals 104 are cut, and installing the gate drivers or source drivers on the plurality of chip positioning areas **1021-102*n*** is performed.

Step S112: If the electrical parameter is inconsistent with the predetermined value, reexamining the signal lines on the glass substrate 101 is performed.

In the process of manufacturing the liquid crystal display 100, the plurality of chip positioning areas **1021-102*n* are formed on a glass substrate 101. A plurality of data linking terminals 104 are disposed on the plurality of chip positioning areas 1021-102*n* (Step S100). Then, a plurality of signal lines 106 are formed between two neighboring chip positioning areas, e.g. chip positioning areas 1021 and 1022. Each signal line 106 is linked between the plurality of data linking terminals 104 of the neighboring chip positioning areas 1021 and 1022(Step S1102). Thereafter, a testing circuit 108 is formed on each chip positioning area, and is connected to the plurality of data linking terminals 104 (Step S104). Then, a voltage or a current is applied on testing points 110, 111, while an electrical parameter in terms of a voltage value or a current value is obtained by detecting a voltage or a current across the testing points 110, 111. The electrical parameter represents the resistance between the testing points 110, 111 (Step S106). Then, a step of determining whether the electrical parameter is consistent with a predetermined value is performed (Step S108). The number and the total length of the plurality of signal lines 106 are known, and each signal line 106 can be referred as a resistor, so the predetermined value is indicative of a resistance associated with an entire path between the testing point 110 and 111 without any open-circuit signal line. If the electrical parameter is consistent with the predetermined value, the connections among the testing circuit 108 and the plurality of data linking terminals 104 are cut by using laser devices 112, and then the gate drivers or source drivers can be installed on the plurality of chip positioning areas 1021-102*n*(Step S110). Alternatively, if the electrical parameter is inconsistent with the predetermined value, it indicates that somewhere of the plurality of the signal lines between the testing points 110, 111 are cut off. So taking the glass substrate 101 away from the production line, and reexamining all the signal lines on the glass substrate 101 are required (Step S112**).

It should be noted that, subsequent to Step S104, measuring the resistance value of each signal lines 106 is also allowed. If the resistance value is infinite (indicating the measured signal line being open circuit) or equals to zero (indicating the measured signal line possibly connected to another signal line), the glass substrate 101 is required to be taken away from the production line to reexamine each signal line on the glass substrate 101.

Figure 4:
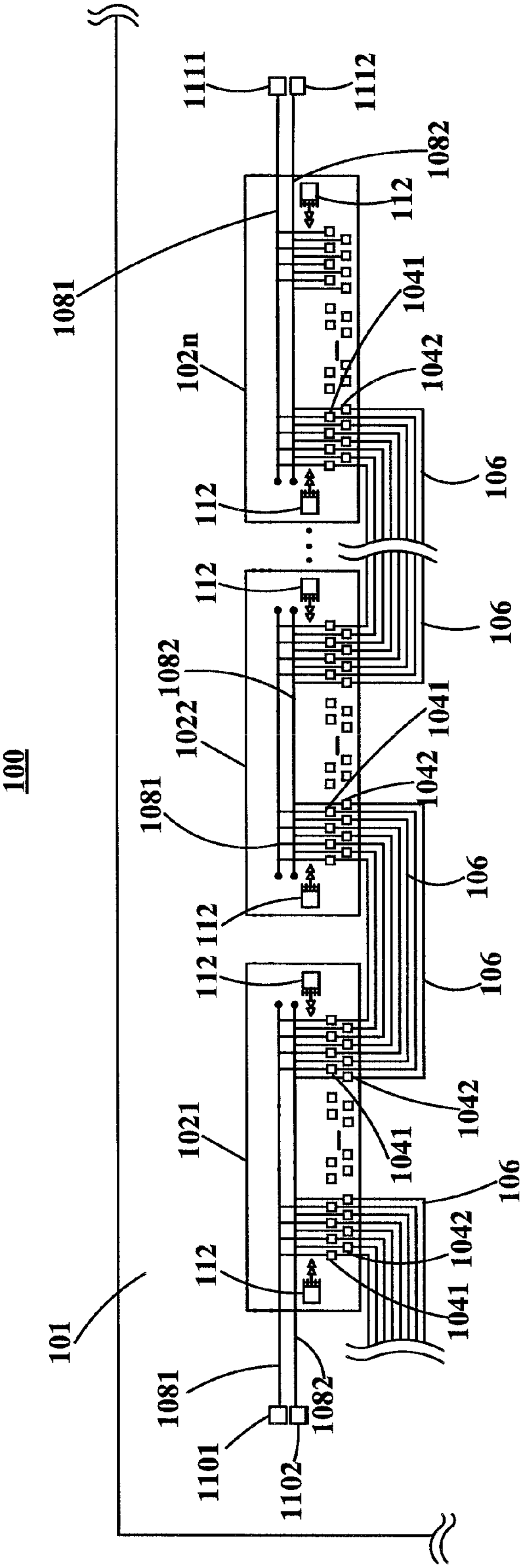
FIG. 4 shows another embodiment of a glass substrate of a liquid crystal display before the drivers are installed on the glass substrate.
Figure 5:
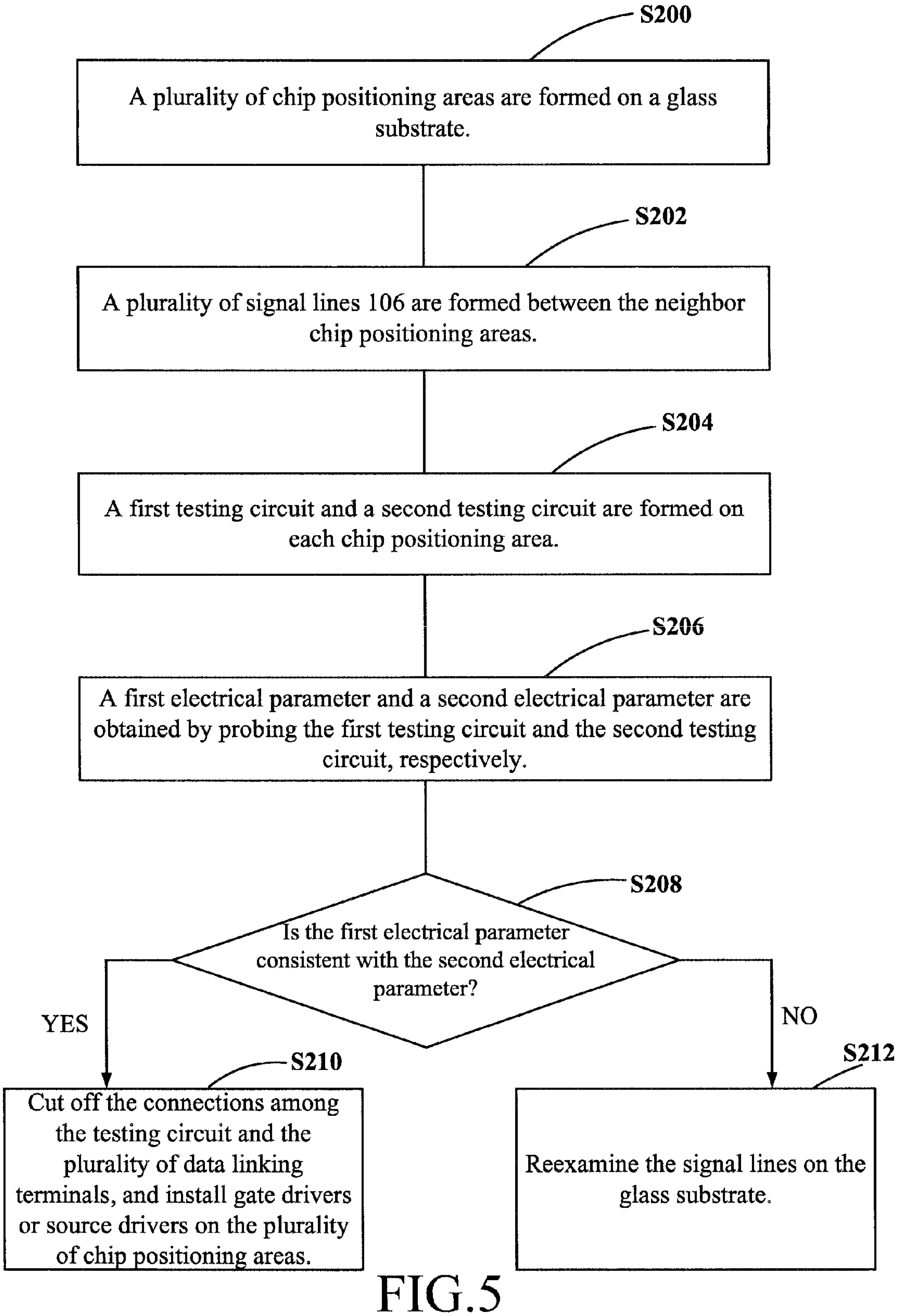
FIG. 5 is a flow chart of testing the glass substrate depicted in FIG. 4.

FIG. 4 shows another embodiment of a glass substrate 101 of a liquid crystal display 100 before the drivers are installed on the glass substrate 101. FIG. 5 is a flow chart of testing the glass substrate 101 depicted in FIG. 4. The method of testing the glass substrate comprises the following steps:

Step S200: A plurality of chip positioning areas **1021-102*n* are formed on a glass substrate 101. A plurality of data linking terminals 1041, 1042 are disposed on the plurality of chip positioning areas 1021-102*n***.

Step S202: A plurality of signal lines 106 are formed between the neighboring chip positioning areas. The plurality of signal lines 106 are linked between the plurality of data linking terminals 1041, 1042 of the neighboring chip positioning areas.

Step S204: A first testing circuit 1081 and a second testing circuit 1082 are formed on each chip positioning area. The first testing circuit 1081 and the second testing circuit 1082 are connected to a first amount of data linking terminals 1041, 1042. In other words, the data linking terminals 1041 are electrically connected to the first testing circuit 1081, while the data linking terminals 1042 are electrically connected to the second testing circuit 1082.

Step S206: By probing the first testing circuit 1081 and the second testing circuit 1082, a first electrical parameter and a second electrical parameter are obtained, respectively.

Step S208: Is the first electrical parameter consistent with the second electrical parameter?

Step S210: If the first electrical parameter is consistent with the second electrical parameter, the connections among the first testing circuit 1081 and the plurality of data linking terminals 1041 as well as the connections among the second testing circuit 1082 and the plurality of data linking terminals 1042 are cut off. And installing the gate drivers or source drivers on the plurality of chip positioning areas **1021-102*n*** is performed.

Step S212: If the electrical parameter is inconsistent with the predetermined value, reexamine the signal lines on the glass substrate 101.

In the process of manufacturing the liquid crystal display 100, the plurality of chip positioning areas **1021-102*n* are formed on a glass substrate 101. A plurality of data linking terminals 1041, 1042 are disposed on the plurality of chip positioning areas 1021-102*n* (Step S200). Then, a plurality of signal lines 106 are formed between two neighboring chip positioning areas, e.g. chip positioning areas 1021 and 1022. Each signal line 106 is linked between the plurality of data linking terminals 1041, 1042 of the neighboring chip positioning areas 1021 and 1022 (Step S202). Thereafter, a first testing circuit 1081 and a second testing circuit 1082 are formed on each chip positioning area, and are respectively connected to the plurality of data linking terminals 1041, 1042. In this embodiment, for example, eight data linking terminals 1041 are connected to the first testing circuit 1081, while eight data linking terminals 1042 are connected to the second testing circuit 1082, (Step S204). Then, a voltage or a current is applied on testing points 1101, 1111, while a first electrical parameter in terms of a voltage value or a current value is obtained by detecting a voltage or a current across the testing points 1101, 1111. Also, a voltage or a current is applied on testing points 1102, 1112, while a second electrical parameter in terms of a voltage value or a current value is obtained by detecting a voltage or a current across the testing points 1102, 1112. The first and second electrical parameters represent the resistance between the testing points 1101, 1111, and the testing points 1102, 1112 respectively. (Step S206). Then, a step of determining whether the first electrical parameter is consistent with the second electrical parameter is performed (Step S208). It is noted that the number and the total length of signal lines 106 connected to the first testing circuits 1081 between the testing points 1101, 1111 are identical as those of signals lines 106 connected to the second testing circuit 1082 between the testing points 1102, 1112, and each signal line 106 can be referred as a resistor. Accordingly, the first electrical parameter (i.e. a resistance associated with an entire path between the testing points 1101 and 1111) is theoretically similar to the second electrical parameter (i.e. a resistance associated with an entire path between the testing points 1102 and 1112). If the first electrical parameter is consistent with the second electrical parameter, the connections among the testing circuit 1081 and the plurality of data linking terminals 1041, and the connections among the testing circuit 1082 and the plurality of data linking terminals 1042 are cut by using laser devices 112. And then the gate drivers or source drivers can be installed on the plurality of chip positioning areas 1021-102***n* (Step S210). Alternatively, if the first electrical parameter is inconsistent with the second electrical parameter, indicating that somewhere of the plurality of the signal lines between the testing points 1101, 1111 are cut off. So taking the glass substrate 101 away from the production line, and reexamining all the signal lines on the glass substrate 101 are required (Step S212).

In this embodiment, two testing circuits 1081, 1802 are disposed on each chip positioning area, however, the used number of testing circuits and the used number of the signal lines connected to each testing circuit depends on the design demand. In other words, two or more testing circuits are also allowed. In addition, the electrical parameter is varied as the used number of the signal lines connected to each testing circuit.

Figure 6:
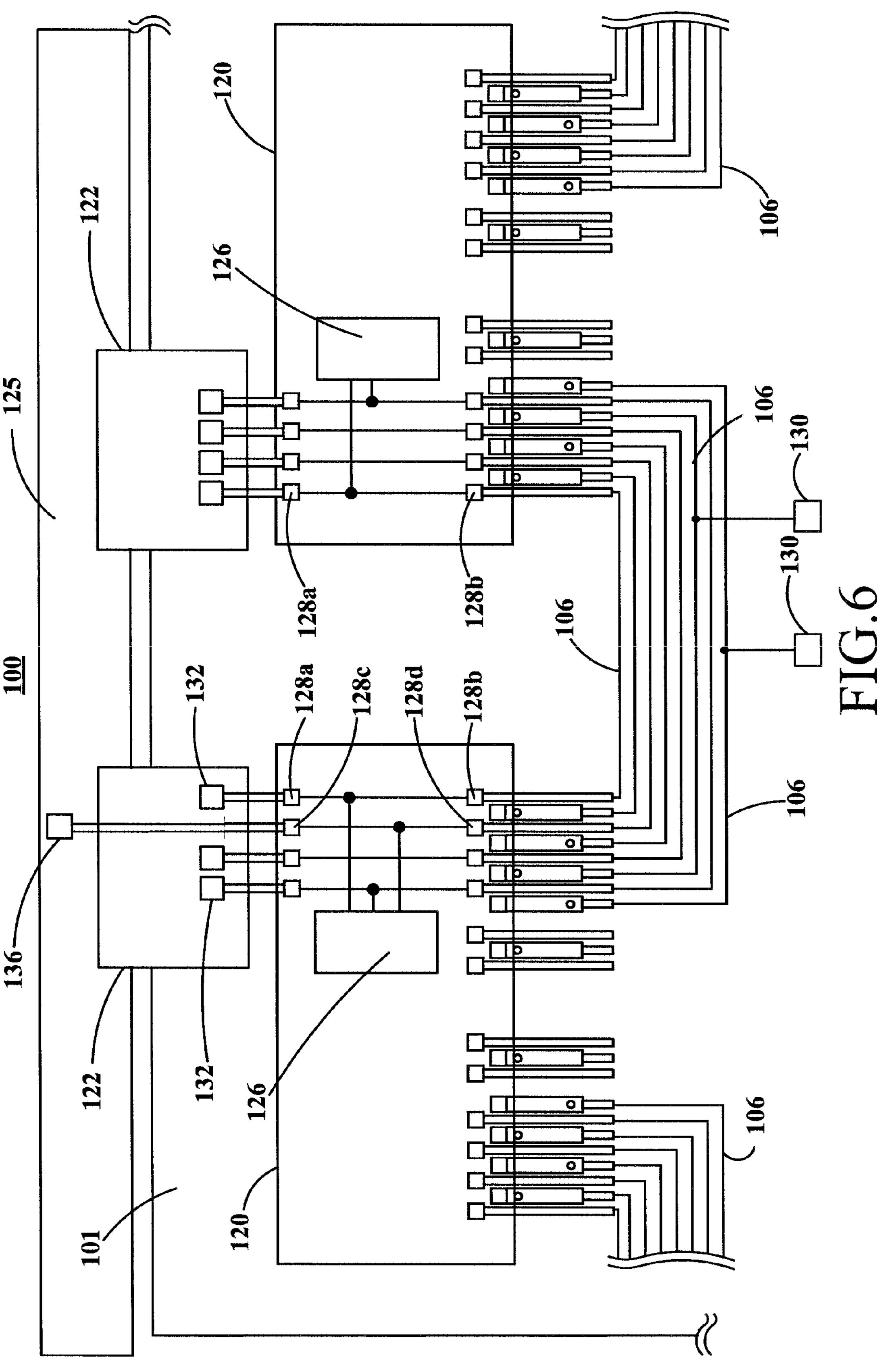
FIG. 6 shows a diagram of drivers installed on the glass substrate.
Figure 7:
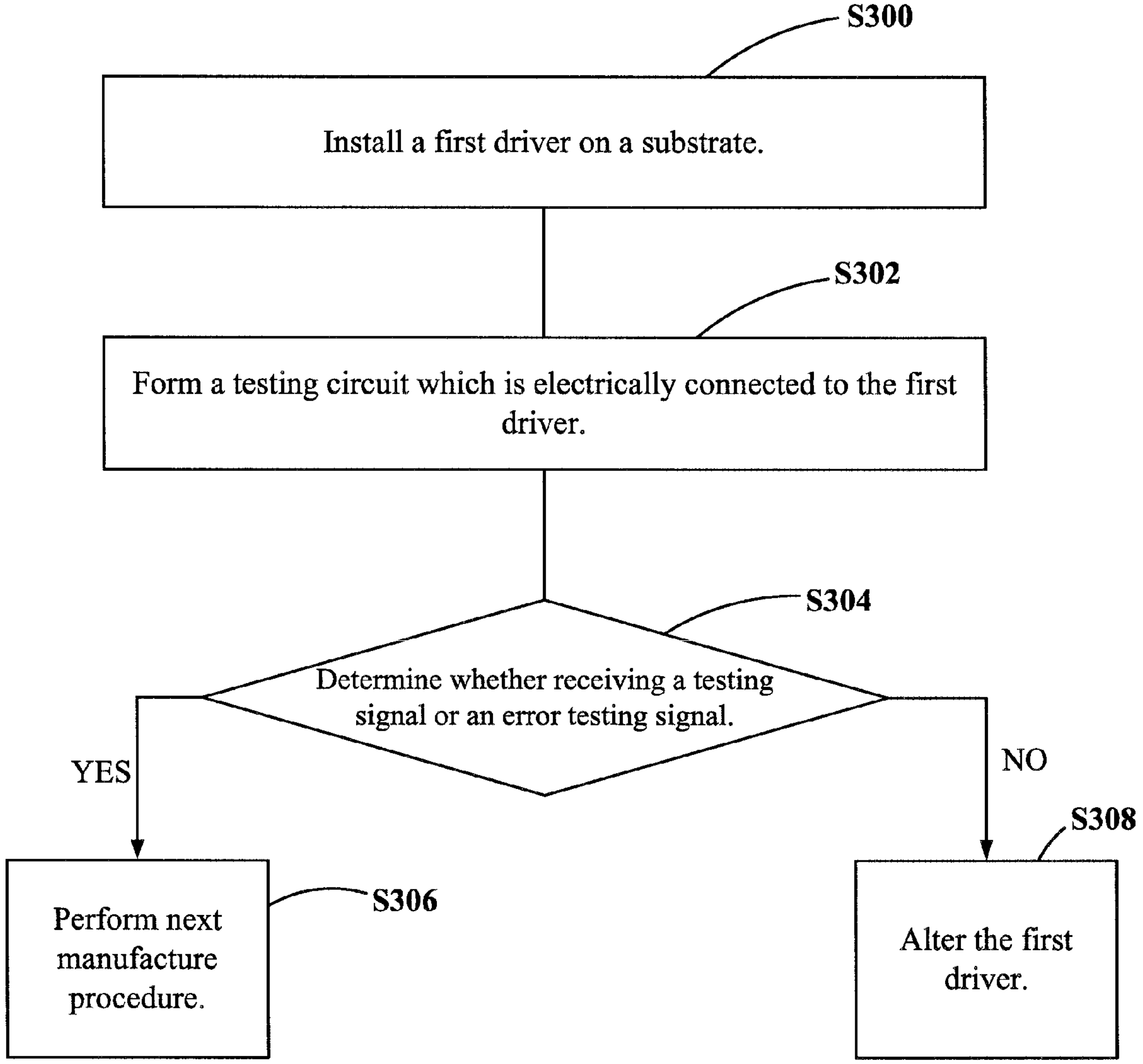
FIG. 7 is a flow chart of testing the glass substrate depicted in FIG. 6.

FIG. 6 shows a diagram of drivers installed on the glass substrate 101, and FIG. 7 is a flow chart of testing the glass substrate 101 depicted in FIG. 6. The method of testing the glass substrate comprises the following steps:

Step S300: A first driver and a second driver are installed on a substrate. The first driver and the second driver are linked by using a plurality of signal lines.

Step S302: A testing circuit which is electrically connected to the first driver is formed.

Step S304: Determine whether receiving a testing signal or an error testing signal.

Step S306: When receiving a correct testing signal, perform next manufacture procedure.

Step S308: When the testing signal is not received or an error testing signal is detected, alter the first driver.

After the procedures for examining the signal lines 106, a plurality of drivers 120 (e.g. gate drivers or source drivers) are positioned on chip positioning areas. The drivers 120 comprises pins 128*a*, 128*b* aligned with data linking terminals on the chip positioning area, so that the drivers 120 are connected in cascade (Step S300). Then, a testing circuit 130 is formed to electrically connect to the driver 120. As can been seen in FIG. 6, the testing circuit 130 is located on the glass substrate 101 and electrically connected to the driver 120 and is electrically connected to a signal line 106. For clarify, only a testing circuit 130 linked to a signal line 106 is shown, yet disposing two or more testing circuits 130, each electrically connected to a signal line 106, is allowed to measure each signal line. Furthermore, a testing circuit 132 can be disposed on a film 122 or a testing circuit 136 can be disposed on a print circuit board 125, each of which has similar functions as the testing circuit 130. The testing circuit 132 is capable of being electrically connected to the signal line 106 on the glass substrate 101 through a bridge connection of the pins 128*a* and 128*b*. Similarly, the testing circuit 136 is electrically connected to the signal line 106 on the glass substrate 101 through a bridge connection of the pins 128*c* and 128*d*. Next, the testing circuit 130, 132, 136 detects whether a test signal generated from an internal circuit 126 of the driver 120 is received (Step S304). For clarify, part of connection between the internal circuit 126 and the testing circuit 132 is omitted. When the testing circuit 130, 132, 136 receives a correct testing signal, indicating that the driver 120 can normally transmit signal, the glass substrate 101 with the drivers can be deliver to next manufacture procedure (Step S306). On the contrary, when either the testing circuit 130, 132, 136 fails to receive the testing signal or detects an error testing signal, indicating that the driver 120 fails to normally transmit signal, altering the driver 120 is possibly required (Step S308).

Figure 8:
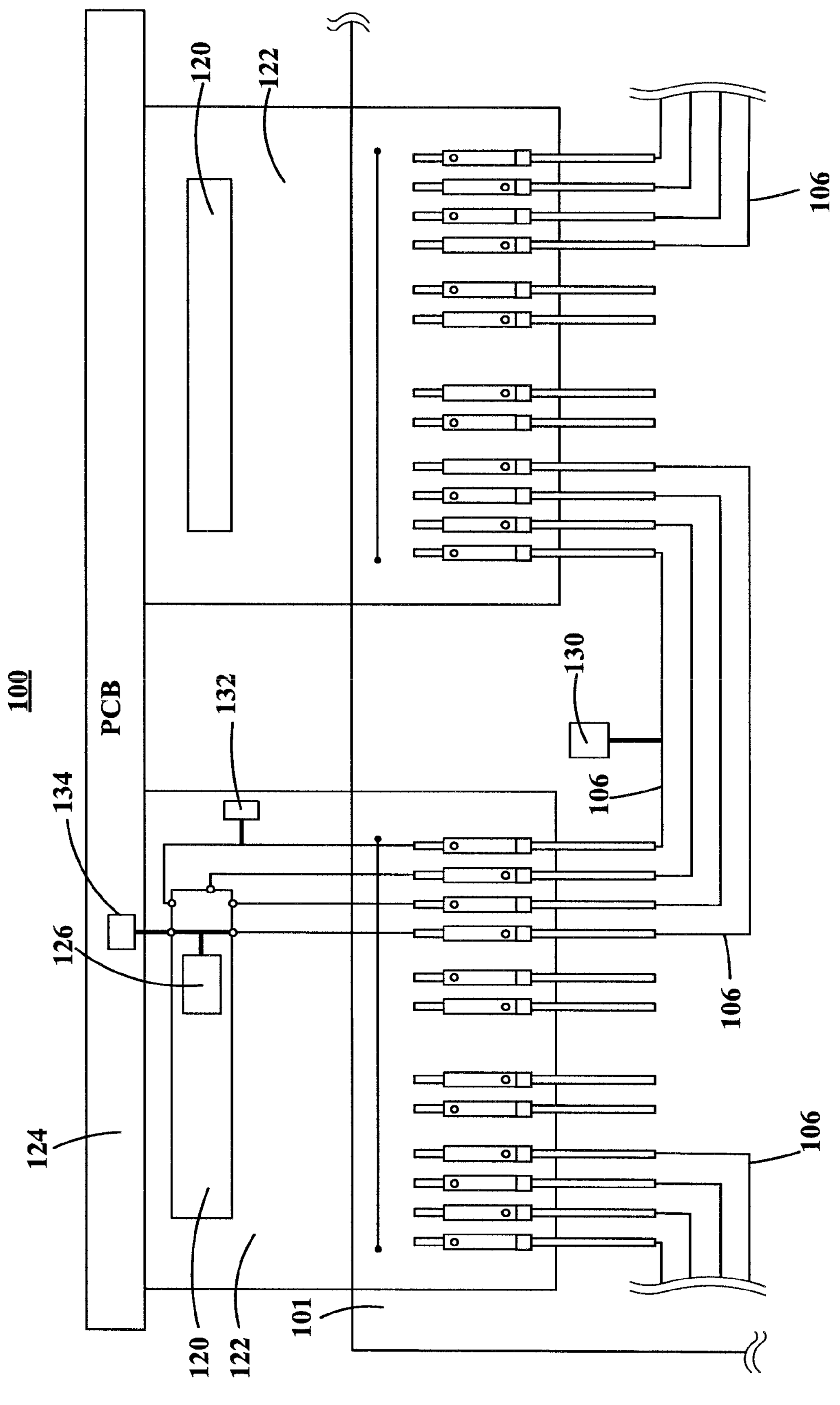
FIG. 8 shows a plurality of drivers installed on a glass substrate.

Referring to FIG. 7 and FIG. 8, FIG. 8 shows a plurality of drivers installed on a glass substrate 101. By using the technique of chip on glass (COG), the drivers are installed on the glass substrate 101 as shown in FIG. 6. By contrast, as can been seen in FIG. 8, the drivers are installed on the flexible circuit board 122 by using the technique of Tape Automated Bonding (TAB) or Chip on Film (COF). Differing from FIG. 6, the testing circuit can be disposed on a print circuit board 124, glass substrate or a flexible circuit board.

Accordingly, the present invention provides a procedure of detecting whether a signal line is normal in time after forming the signal line connected between two adjacent drivers on a glass substrate. In addition, the present invention also provides a method of testing whether a data transmission between two drivers is normal after fixing the two chips on the glass substrate. Consequently, if one of the drivers fails to transmit a signal normally or a signal line connected between two adjacent drivers is cut, eliminating the malfunction driver or mending the signal line is proper to avoid flowing into next manufacture process.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method, comprising; testing a liquid crystal display by performing the steps of (a) installing a plurality of drivers on a substrate, the plurality of drivers being linked in cascade via a plurality of signal lines, wherein at least one of the plurality of drivers has an internal circuit capable of generating a test signal;

(b) forming a testing circuit which is electrically connected to one of the plurality of drivers;

(c) probing the testing circuit to receive the test signal; and (d) replacing the driver electrically connected to the testing circuit while the test signal received is inconsistent with a predetermined value.

2. The method of claim 1, wherein the plurality of drivers are source drivers, wherein the source drivers are connected to a timing controller which is used for generating a clock signal.

3. The method of claim 1, wherein the plurality of drivers are gate drivers, wherein the gate drivers are connected to a timing controller which is used for generating a clock signal.

4. The method of claim 1, wherein the substrate is made of glass.

5. The method of claim 1, wherein the testing circuit is formed on the substrate.

6. The method of claim 1, wherein the substrate is a flexible circuit board.

7. The method of claim 6, wherein the liquid crystal display further comprises a printed circuit board, and the testing circuit is formed on the printed circuit board.

8. The method of claim 1, wherein the testing circuit is connected to one of the plurality of signal lines.

9. The method of claim 1, wherein the test signal received comprises a value of a voltage or a current probed by the testing circuit.

* * * * *